United States Patent [19]

Morikawa et al.

[11] Patent Number: 5,569,974
[45] Date of Patent: Oct. 29, 1996

[54] ELECTRON-EMITTING DEVICE AND ELECTRON BEAM LITHOGRAPH MACHINE AND IMAGE DISPLAY APPARATUS MAKING USE OF IT

[75] Inventors: Yuko Morikawa, Kawasaki; Yoshihiro Yanagisawa, Atsugi; Kiyoshi Takimoto, Kawasaki, all of Japan

[73] Assignee: Canon Kabushiki Kaisha, Tokyo, Japan

[21] Appl. No.: 273,630

[22] Filed: Jul. 12, 1994

Related U.S. Application Data

[63] Continuation of Ser. No. 137,813, Oct. 19, 1993, abandoned, which is a continuation of Ser. No. 501,882, Mar. 30, 1990, abandoned.

[30] Foreign Application Priority Data

| Mar. 30, 1989 | [JP] | Japan | 1-76605 |
| Mar. 27, 1990 | [JP] | Japan | 2-75764 |

[51] Int. Cl.⁶ .................. H01J 1/30; H01J 29/48; H01J 37/317
[52] U.S. Cl. .................. 313/310; 313/309; 313/444; 313/446; 313/306
[58] Field of Search .................. 313/306, 308, 313/309, 336, 444, 446, 310; 250/492.2, 423 F

[56] References Cited

U.S. PATENT DOCUMENTS

| 3,755,704 | 8/1973 | Spindt et al. | 313/336 |
| 4,742,234 | 5/1988 | Feldman et al. | 250/492.2 |
| 4,924,144 | 5/1990 | Menn et al. | 340/760 |

FOREIGN PATENT DOCUMENTS

| 0262676 | 4/1988 | European Pat. Off. . |
| 0289278 | 11/1988 | European Pat. Off. . |
| 0367195 | 5/1990 | European Pat. Off. . |
| 854321 | 4/1940 | France . |
| 30336219 | 5/1982 | Germany . |
| 3741124A1 | 6/1989 | Germany . |
| 60-175352 | 9/1985 | Japan . |
| 5698827 | 8/1991 | Japan . |

OTHER PUBLICATIONS

Gould et al: Thin Solid Films, 30 (1975), pp. 131–135.
"MOS–Sandwich–Gitter–Diode zur Erzeugung von Feldionisationsfeldstarken an der Phasengrenze Festkorper/Gas", H. Gentsch et al., Zeitschrift Fur Naturforschung, Teil a, Astrophysick, Physick Phsikalische Chemie, vol. 26, No. 6, Jun. 1971, pp. 1010–1016.

*Primary Examiner*—Nimeshkumar Patel
*Attorney, Agent, or Firm*—Fitzpatrick, Cella, Harper & Scinto

[57] ABSTRACT

An electron-emitting device comprises a substrate, an electrode provided on said substrate, an insulating layer laminated on the electrode, and a second electrode having an opening and laminated on the insulating layer in such a manner that the insulating layer is uncovered at the opening and electrons are emitted from the opening of the second electrode as a result of application of an voltage between the electrodes. An image display apparatus comprises the electron-emitting device, a modulating electrode capable of modulating an electron beam emitted from the electron-emitting device, in accordance with an information signal, and an image forming member capable of forming an image as a result of irradiation with the electron beam, these of which are successively disposed. An image forming apparatus comprises the electron-emitting device, and a means for modulating an electron beam emitted from said electron-emitting device, in accordance with an information signal.

4 Claims, 5 Drawing Sheets

ELECTRON-EMITTING DEVICE AND ELECTRON BEAM LITHOGRAPH MACHINE AND IMAGE DISPLAY APPARATUS MAKING USE OF IT

This application is a continuation of application Ser. No. 08/137,813 filed Oct. 19, 1993, now abandoned, which is a continuation of application Ser. No. 07/501,882 filed Mar. 30, 1990, abandoned.

BACKGROUND OF THE INVENTION

1. Field of the Invention

The present invention relates to an electron-emitting device, and more particularly to an electron-emitting device having the structure in which an insulating layer is interposed between a pair of electrodes. It also relates to an electron beam lithography machine and an image display apparatus which make use of the device.

2. Related Background Art

Figure 6:
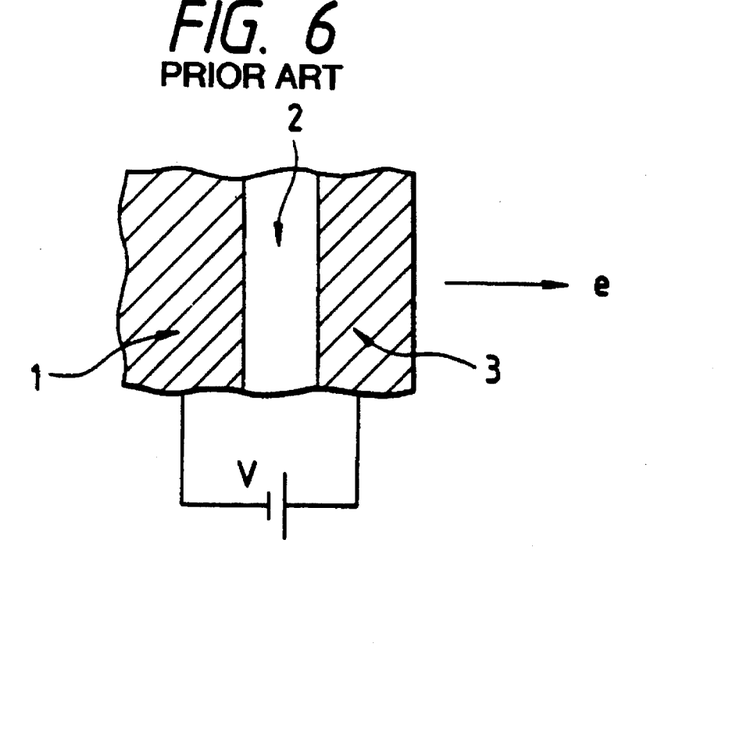
FIGS. 6 and 7 diagramatically illustrate a constitution commonly taken in conventional MIM-type electron-emitting devices.
Figure 7:
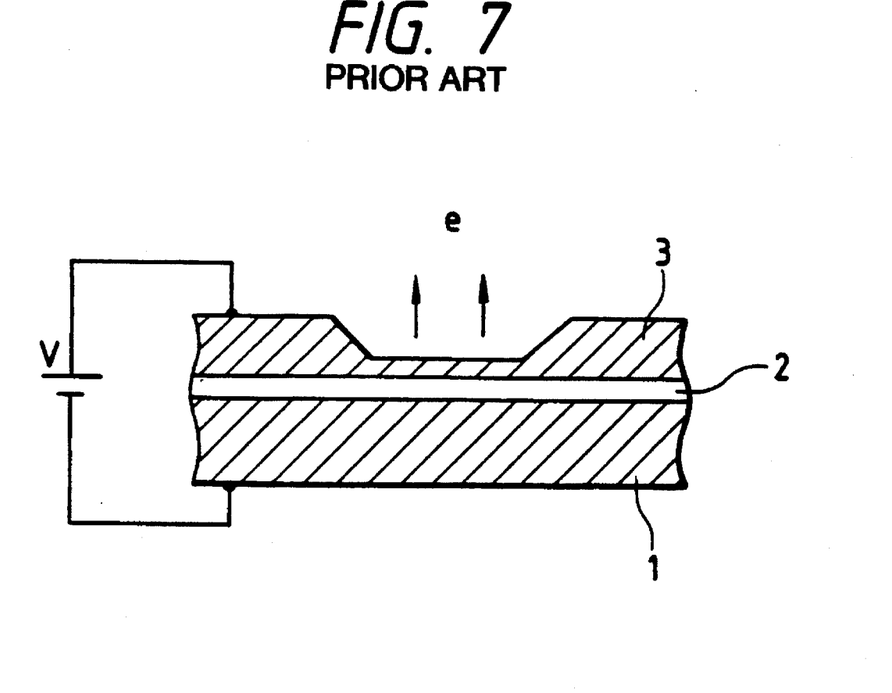

FIGS. 6 and 7 diagramatically illustrate a constitution commonly taken in MIM-type electron-emitting devices.

As shown in FIGS. 6 and 7, an electron-emitting device of the MIM-type comprises an electrode 1 and a surface electrode 3 which is thin and laminated thereon, and interposing therebetween an insulating layer 2 which is thin. The electrode on the side from which electrons are emitted is hereinafter particularly called the surface electrode. Then, a voltage V larger than the work function $\phi m$ of a metal used in the surface electrode 3 is applied between the electrode 1 and the surface electrode 3. As a result, among electrons that have tunneled through the insulating layer 2, those having a larger energy than the vacuum level are emitted from the surface of the surface electrode 3.

In order to obtain a high electron-emission efficiency in such a device, it is preferable that the insulating layer 2 is made small in thickness so that the energy of tunneled electrons and the number thereof can be increased and also that as shown in FIG. 7 the surface electrode 3 should preferably be formed with a thickness as small as possible so that a decrease in energy because of the scattering or the like in the surface electrode 3 is prevented. It is further preferable that a metallic material having a small work function $\phi m$ is used in the surface electrode 3 (Japanese Unexamined Patent Publications No. 124327/1988 and No. 141234/1988).

However, in the case when a film thickness is very small, metals commonly tend to take an island structure, and it is very difficult to form such a metallic thin film as mentioned above. Moreover, even if it has become possible to form a metallic thin film as the surface electrode, since the resistance is larger, particularly there is a high specific resistance at metal materials having a small work function, a fall of voltage in the surface electrode 3 can not be ignored and thus there is a possibility that a uniform and effective electric field is not applied to the electron-emitting device. There is also a possibility that a loss of electric power in the surface electrode 3 because of such a fall of voltage causes a break in the device. Hence, there is a limit to the formation of the surface electrode 3 with a small thickness, resultingly also bringing about a limit to the improvement in electron-emission efficiency.

The electron-emission efficiency can be improved to a certain extent with a decrease in thickness of the surface electrode, but, on the other hand, new problems may arise such that the cross-sectional shape of an electron beam emitted from the surface electrode 3 becomes poor and also the fluorescent luminance attributable to the electron beam also becomes non-uniform with a decrease in thickness of the surface electrode 3. More specifically, when a fluorescent member capable of exhibiting fluorescence as a result of irradiation with electron beams is disposed right above the surface electrode 3, it follows, with a decrease in thickness of the surface electrode 3 as in the above, that a fluorescent spot formed on the surface of the fluorescent member does not reflect the electrode shape of the surface electrode 3 to have an unnecessary spread. In addition, the luminance at the above fluorescent spot may also become non-uniform, resulting in a fluorescence uneveness. Moreover, once the cross-sectional shape of the electron beam has become bad or the fluorescent luminance has become non-uniform (luminance uneveness) as mentioned above, there must arise the problem that the resolution of an image is lowered, the luminance is lowered and the luminance uneveness occurs particularly when such an MIM-type electron-emitting device is used as an electron source of an image display apparatus or an electron beam lithography machine.

SUMMARY OF THE INVENTION

An object of the present invention is to provide an MIM-type electron-emitting device that can assure a resistance of such a low level that the fall of voltage in the surface electrode can be ignored, and also has an improved electron-emission efficiency.

Another object of the present invention is to provide an MIM-type electron-emitting device that can at the same time achieve an improvement in the electron-emission efficiency and an improvement of the cross-sectional shape of electron beams and the luminance uneveness.

Still another object of the present invention is to provide an image display apparatus and an electron beam lithography machine which make use of the above MIM-type electron-emitting device and can achieve a superior resolution of an image and a superior luminance.

The present invention provides an electron-emitting device comprising a substrate, an electrode provided on said substrate, an insulating layer laminated on said electrode, and a second electrode having an opening and laminated on said insulating layer in such a manner that the insulating layer is uncovered at the opening and electrons are emitted from the opening of the second electrode as a result of application of an voltage between the electrodes.

The present invention also provides an image display apparatus comprising an electron-emitting device, a modulating electrode capable of modulating an electron beam emitted from said electron-emitting device, in accordance with an information signal, and an image forming member capable of forming an image as a result of irradiation with said electron beam, wherein said electron-emitting device comprises a substrate, an electrode provided on said substrate, an insulating layer laminated on said electrode, and a second electrode having an opening and laminated on said insulating layer in such a manner that the insulating layer is uncovered at the opening and electrons are emitted from the opening of the second electrode as a result of application of an voltage between the electrodes.

The present invention still also provides an electron beam lithography machine comprising an electron-emitting device, and a means for modulating an electron beam emitted from said electron-emitting device, in accordance with an information signal; wherein said electron-emitting device comprises a substrate, an electrode provided on said substrate, an insulating layer laminated on said electrode, and a second electrode having an opening and laminated on said insulating layer in such a manner that the insulating layer is uncovered at the opening and electrons are emitted from the opening of the second electrode as a result of application of an voltage between the electrodes.

BRIEF DESCRIPTION OF THE DRAWINGS

Throughout the drawings, the corresponding parts or members are denoted by the same numerals.

DETAILED DESCRIPTION OF THE PREFERRED EMBODIMENTS

In order to achieve the objects previously noted, the electron-emitting device of the present invention is characterized by an MIM-type electron-emitting device in which an opening is provided in its surface electrode so that its insulating layer is uncovered.

More specifically, in the device of the present invention, it is unnecessary to form the surface electrode with a particularly small thickness, and hence it becomes easy to form the film of the surface electrode. It is also possible to keep the resistance of the surface electrode to a low level, and hence the fall of voltage at the surface electrode can be ignored, making it possible to apply an effective electric field to the device and at the same time to prevent the device from being broken because of the generation of heat. On the other hand, the electrons that have tunneled the insulating layer and reached the opening of the surface electrode, i.e., the uncovered area of the insulating layer, can be emitted out of the device without the loss of energy due to the scattering in metals. The opening of the surface electrode may also be provided in a large number, whereby emission currents can be increased. Minute openings may also be provided in a large number, whereby it becomes possible to ignore the disturbance of electric fields in the insulating layer, so that uniform and effective electric fields can be applied to the device, bringing about an improvement in the emission efficiency.

The disadvantages that the cross-sectional shape of an electron beam emitted from the surface electrode 3 becomes poor and also the fluorescent luminance attributable to the electron beam also becomes non-uniform, as in the case when the surface electrode 3 is formed with a small thickness, may no longer be brought about, and thus the electron-emission efficiency can be improved.

Taking account of the electric field in the insulating layer, its uniformity is retained only in the vicinity of the periphery of the opening of the surface electrode and it becomes smallest in the vicinity of the center of the opening, so that the number of electrons emitted from the central area tends to become smaller. Hence, the size of the opening may preferably be as minute as possible in order to keep the uniformity of electric fields, and the periphery of the opening may preferably be present in as large a number as possible. The size (width: W in FIG. 1) of the opening, which is the distance between opposed points on the periphery, may preferably be 100 µm or less, and particularly 10 µm or less. The opening may further preferably be made as minute as possible within the range of presently available processing accuracy. The larger the number of the openings within the area of a device is, the larger the number of emitted electrons becomes. Hence, the opening should preferably be provided in the number as large as possible to the extent that the electrode resistance can be kept low using, e.g., a method by which the electrode is made to have a large film thickness. For this reason, the proportion of areas of the openings to the area of a device may preferably be 50% or less and more preferably be 20% or less.

The present invention will be described below in detail with reference to the drawings.

Figure 1:
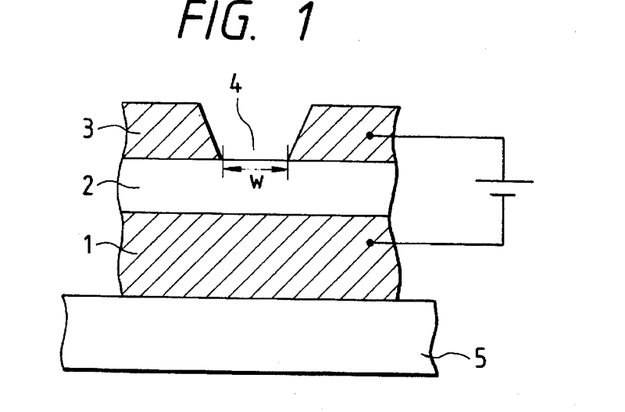
FIG. 1 schematically illustrates a cross section of an example of the electron-emitting device according to the present invention, FIGS. 2A and 2B respectively illustrate a pattern (shape of electrode) of a surface electrode of the electron-emitting device according to the present invention, and a plan view of the electron-emitting device.

FIG. 1 is a cross section to illustrate a constitution of the MIM-type electron-emitting device according to the present invention. An electrode 1 and a surface electrode 3 in pairs and an insulating layer 2 held between these electrodes are provided on a substrate 5. An opening 4 is also provided in the surface electrode 3.

Here will be described an example of an electron-emitting device comprising an organic insulating film used as the insulating layer 2.

For the formation of the organic thin film insulating layer, it is possible to apply vacuum deposition, molecular beam epitaxy, electrolytic polymerization or the like. Since, however, the length through which electrons can tunnel a potential barrier is very small, the organic insulating film layer should comprise an ultra-thin film, in other words, should have a film thickness in the range from several Å to several hundred Å, preferably not more than 200 Å, and more preferably not more than 100 Å and not less than 5 Å. In addition, whether or not the layer is homogeneous in the in-plane direction and thickness direction of the insulating thin film greatly influences the device performance and its stability. Hence, care with respect to these factors must be taken.

A most suitable method of forming the insulating thin film in a preferred embodiment of the present invention includes the LB method.

The LB method is a method by which a monomolecular film or a built-up film thereof is prepared by utilizing the mechanism that, when in a structure having a hydrophilic part and a hydrophobic part in the molecule the balance between the both is appropriately kept, molecules form a monomolecular layer with the hydrophilic groups down on a water surface.

According to this LB method, a monomolecular film, or a built-up film thereof, of an organic compound having the hydrophobic part and the hydrophilic part in its molecule can be readily formed on any electrode or any substrate containing any electrode. The film can have a film thickness of a molecular length order, and also can provide a uniform and homogeneous organic ultra-thin film over a wide area.

Materials for the electrodes between which such an LB film is held may be any of those having a high conductivity, including a great number of materials as exemplified by metals such as Au, Pt, Ag, Pd, Al, In, Sn and Pb, or alloys of these, and also graphite or silicide, as well as conductive oxides such as ITO, these of which can be intended to be applied in the present invention.

As methods of forming the electrodes employing such materials, conventionally known thin-film techniques may be satisfactory. However, as care should be taken here, particularly in instances in which the LB film does not have stability with respect to thermal treatment and solvent resistance, a preparation or processing step that requires, for example, a high temperature (>100° C.) should preferably be avoided so that the LB film may not be damaged when an electrode is further formed on an already formed LB film.

In order to take electrons out of the electrode without providing the opening, the electrode may preferably have a thickness of 500 Å or less, and more preferably 200 Å or less.

On the other hand, in the present invention, the substrate 5 that supports thin films, on which the electrodes 1 and 3 and the insulating layer 2 are laminated, may be of any material including metals, glass, ceramics, and plastic materials. It may also have any shape, preferably that of a flat sheet, but is by no means limited to the flat sheet. This is because the above film formation method has the advantage that a film can be formed with a shape exactly corresponding to the surface of the substrate whatever shape the surface has.

In view of the advantages attributable to the electron-emitting device of the present invention as describe above, it can be suitably used, in particular, as an electron source in an image display apparatus and an electron beam lithography machine in both of which a high resolution and an high luminance are required.

Namely, the image display apparatus and the electron beam lithography machine that make use of the above electron-emitting device of the present invention are;

An image display apparatus comprising an electron-emitting device, a modulating electrode capable of modulating an electron beam emitted from said electron-emitting device, in accordance with an information signal, and an image forming member capable of forming an image as a result of irradiation with said electron beam, wherein said electron-emitting device comprises a substrate, an electrode provided on said substrate, an insulating layer laminated on said electrode, and a second electrode having an opening and laminated on said insulating layer in such a manner that the insulating layer is uncovered at the opening and electrons are emitted from the opening of the second electrode as a result of application of a voltage between the electrodes; and An electron beam lithography machine comprising an electron-emitting device, and a means for modulating an electron beam emitted from said electron-emitting device, in accordance with an information signal; wherein said electron-emitting device comprises a substrate, an electrode provided on said substrate, an insulating layer laminated on said electrode, and a second electrode having an opening and laminated on said insulating layer in such a manner that the insulating layer is uncovered at the opening and electrons are emitted from the opening of the second electrode as a result of application of a voltage between the electrodes. The above apparatus making use of the electron-emitting device of the present invention will be described below in detail with reference to the drawings.

Figure 4A:
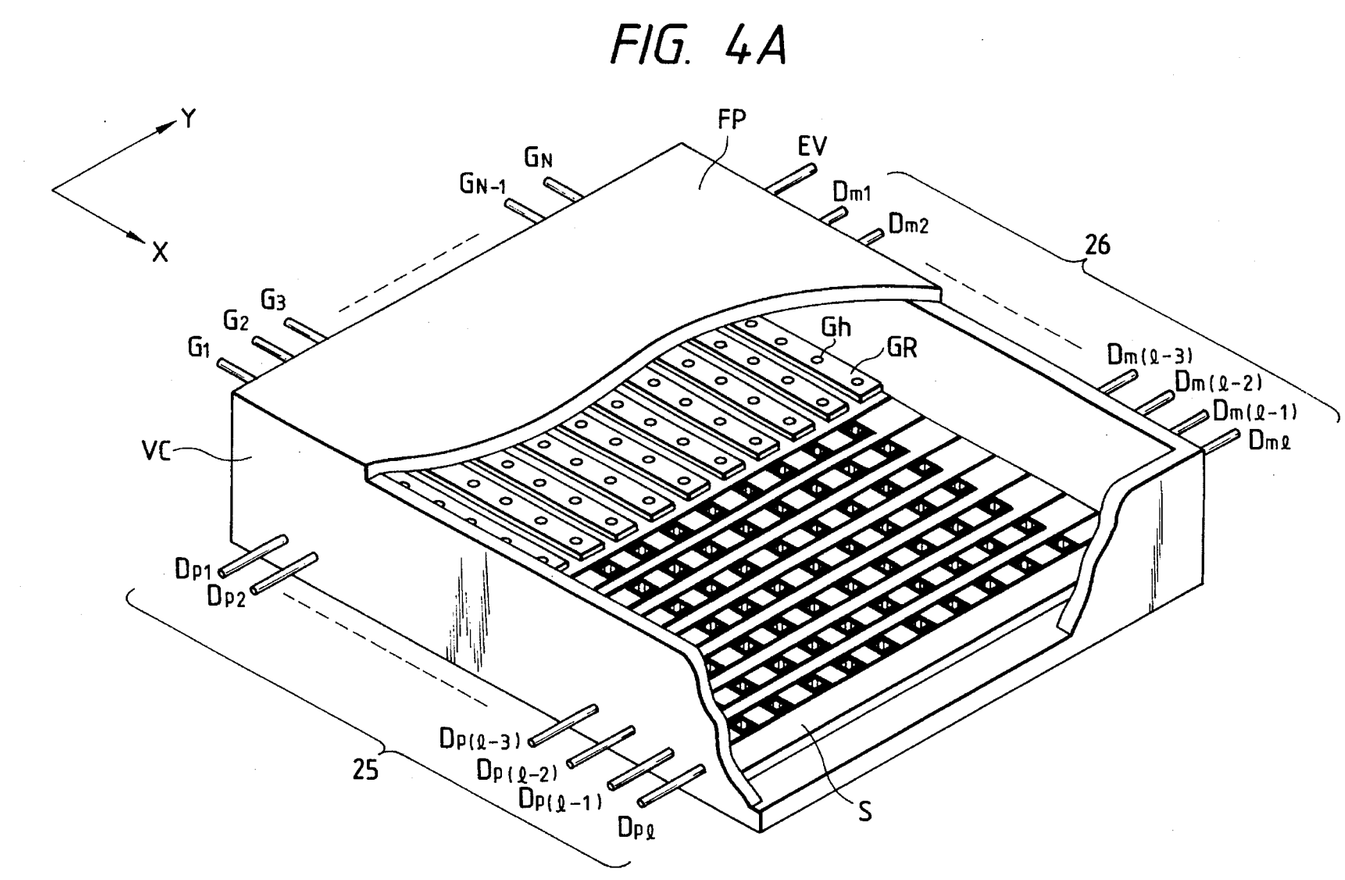
FIGS. 4A and 4B schematically illustrate an image display apparatus making use of the electron-emitting device of the present invention.
Figure 4B:
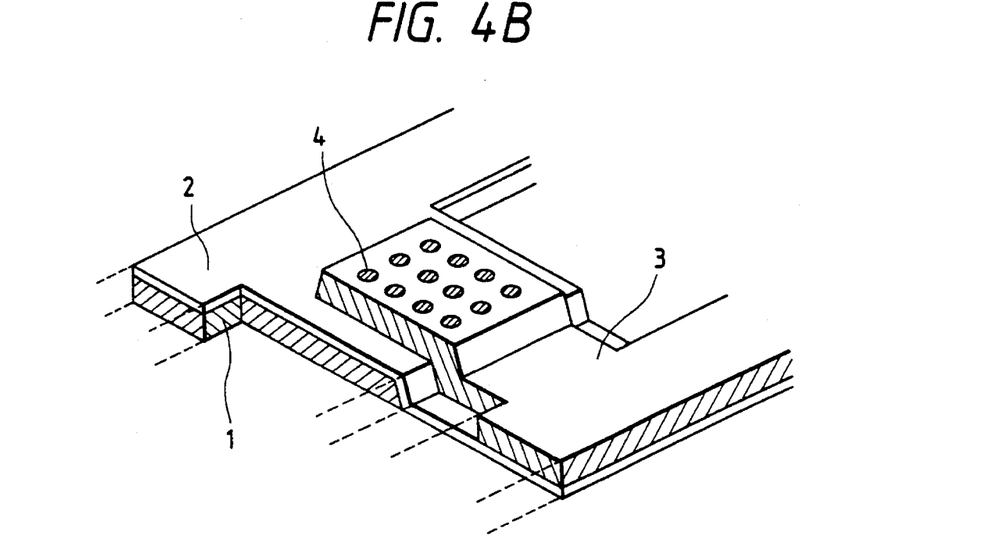

With reference to FIGS. 4A and 4B, an embodiment of a flat-plate image display apparatus in which the present invention is applied will be described.

FIG. 4A is a partially cutaway perspective view to show the structure of a display panel.

How to operate the present apparatus will be described below in order.

FIG. 4A shows the structure of the display panel, in which VC denotes a vacuum container made of glass, and FP, part thereof, denotes a face plate on the display surface side. At the inner face of the face plate FP, a transparent electrode made of, for example, ITO is formed. At the further inner side thereof, red, green and blue fluorescent members (image forming members) are dividedly applied in a mosaic fashion, and provided with a metal back as known in the field of CRT. (The transparent electrode, the fluorescent member and the metal back are not shown in the drawing.) The above transparent electrode is electrically connected to the outside of the vacuum container through a terminal EV so that an accelerating voltage can be applied.

The letter symbol S denotes a glass substrate fixed to the bottom of the above vacuum container VC, on the surface of which the MIM-type electron-emitting device (FIG. 4B) of the present invention is formed in arrangement with number N × lines 1. The group of electron-emitting devices are electrically parallel-connected for each line, and positive-pole side wiring 25 (or negative-pole side wiring 26) of each line is electrically connected to the outside of the vacuum container VC through terminals $D_{p1}$ to $D_{pl}$ (or terminals $D_{m1}$ to $D_{ml}$).

A grid electrode (modulating electrode) GR is formed in a stripe between the substrate S and the face plate FP. The grid electrode (modulating electrode) GR is provided in the number of N, falling under right angles with the line of the electron-emitting device. Grid holes Gh are provided in each electrode, through which electrons are transmitted. The grid holes Gh may be provided one by one corresponding with each electron-emitting device as shown in FIG. 4A, or the number of minute holes may alternatively be provided in a mesh form.

The respective grid electrodes (modulating electrodes) GR are electrically connected to the outside of the vacuum container VC through grid electrode terminals $G_l$ to $G_N$.

In the present display panel, the lines of the electron-emitting devices in the number 1 and the lines of the grid electrodes (modulating electrodes) in the number N constitute an XY matrix. Synchronized with the successive driving (scanning) of the lines of electron-emitting devices line by line, modulating signals alotted to one line of an image are simultaneously applied to the lines of grid electrodes (modulating electrodes) in accordance with information signals. Thus, the irradiation by each electron beam of the fluorescent member can be controlled and the image is displayed line by line.

The image display apparatus as described above can be an image display apparatus capable of obtaining a displayed image particularly with a high resolution, free of luminance unevenness and with a high luminance, because of the advantages attributable to the electron-emitting device of the present invention as previously described.

The electron beam lithography machine making use of the electron-emitting device of the present invention will be described below.

Figure 5:
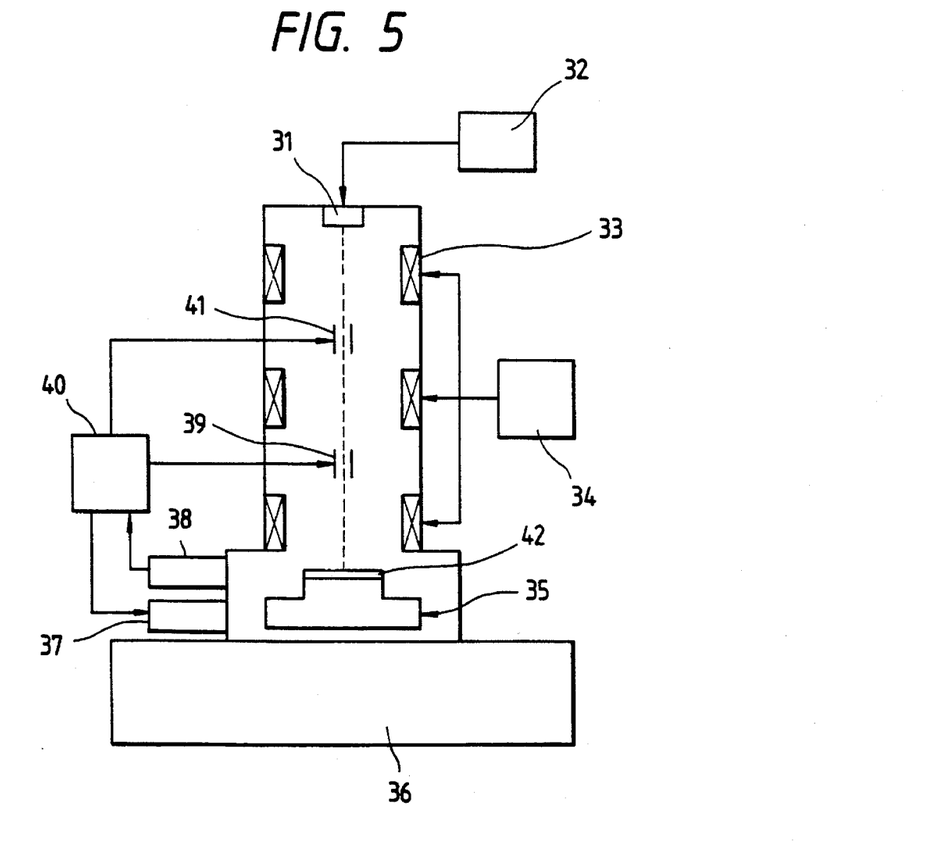
FIG. 5 schematically illustrates an electron beam lithography machine making use of the electron-emitting device of the present invention.

FIG. 5 schematically illustrate the constitution of an embodiment of the electron beam lithography machine. The numeral 31 denotes an electron-emitting device according to the present invention. An electron beam (the dotted line in Fig. 5) emitted from this electron-emitting device 31 forms an image on a wafer 42 provided on a stage 35. The electron beam is modulated, in other words, controlled for ON/OFF of the electron beam, in accordance with information signals of the desired image. A means for modulating the electron beam may merely comprise an electron beam source driving unit 32 capable of ON/OFF-controlling the driving of the device, but, in addition thereto, may comprise, as denoted by the numeral 41 in FIG. 5, a blanking electrode capable of greatly deflecting continuously emitted electron beams so that they may not reach the wafer 42. As described above, the electron beam lithography machine according to the present embodiment is equipped with the electron-emitting device of the present invention and the modulating means as essential constituent factors. In the case when the electron-emitting device that comprises the electron beam source is not in a multiple form, it is necessary to use a deflecting electrode capable of deflecting the electron beam in accordance with information signals. A stage micro-movement mechanism 37, which minutely moves the stage 35 in accordance with information signals, a stage alignment mechanism 38, and a control mechanism 40, which synchronizes these mechanisms (37, 38), the deflecting electrode 39 and the blanking electrode 41, may preferably be further provided in the case when some restriction may arise in the width through which the electron beam is deflected by the deflecting electrode 39. Focusing lenses (an electromagnetic lens 33 and an electromagnetic lens drive unit 34) may preferably be also disposed so that the convergence of a beam of emitted electrons on the wafer 42 can be improved. In FIG. 5, the numeral 36 denotes a vibration insulation pedestal, which prevents image formation accuracy from being lowered by the minute vibration that may occur during image formation.

The electron beam lithography machine as described above can be an electron beam lithography machine capable of obtaining an image formation pattern particularly with a high resolution and with a high accuracy, because of the advantages attributable to the electron-emitting device of the present invention as previously described.

As having been described above in detail, the electron-emitting device according to the present invention has made it unnecessary to form the surface electrode with particularly a small thickness, and has made it possible to uniformly apply an effective voltage to the device and at the same time to prevent the device from being broken because of the generation of heat. Moreover, since electrons can be taken out through the opening of the surface electrode, it has become possible to increase the electron-emission efficiency.

The formation of the insulating layer by the LB method makes it possible to readily achieve the controlling of film thickness of a molecule order and also can give a superior controllability, so that a high reproducibility and a rich productivity can be attained when the devices are formed.

It has also become possible to improve the electron-emission efficiency since it no longer occurs that the cross-sectional shape of the electron beam becomes poor or the fluorescent luminance becomes non-uniform with a decrease in thickness of the surface electrode.

EXAMPLES

The present invention will be described below in greater detail by giving Examples.

Example 1

On a glass substrate 1 (#7059, a product of Corning Glass Works) having been subjected to hydrophobic treatment by letting it stand for 24 hours in a vapor saturated with hexamethyldisilazane (HMDS), Cr was vacuum-deposited as a subbing layer by vacuum deposition with a thickness of 500 Å, and Au was further deposited by the same process (film thickness: 1,000 Å), to form a base electrode in a stripe with a width of 1 mm. On the resulting substrate, monomolecular films composed of polyimide were formed according to the LB method, the procedure of which was as detailed below.

A dimethylacetamide solution in which polyamic acid (molecular weight: about 200000) was dissolved in a concentration of $1\times10^{-3}$ %(W/W) was spread on an aqueous phase of pure water of 20° C. in water temperature to form a monomolecular film on the water surface. The surface pressure of the monomolecular film thus formed was raised up to 25 mN/m. While keeping constant the surface pressure, the above substrate was put in water and drawn up at a rate of 5 mm/min in the direction crossing the water surface. A Y-type monomolecular built-up film was thus prepared. Such operations were repeated to form six kinds of built-up films with 12, 18, 24, 30, 36 or 40 layers. These films were then heated at 300° C. for 10 minutes so that they were formed into polyimide.

Figure 2A:
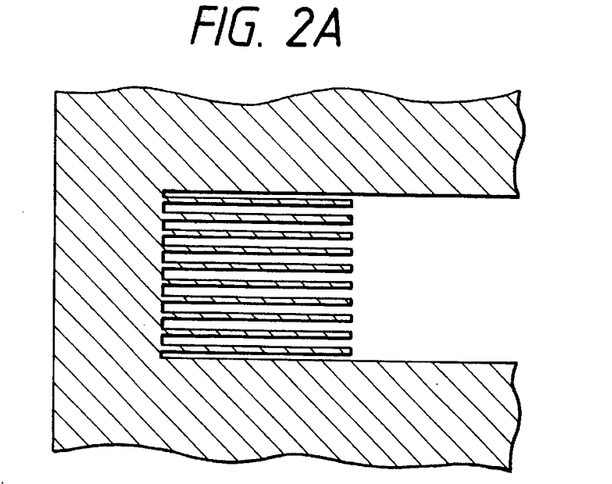
Figure 2B:
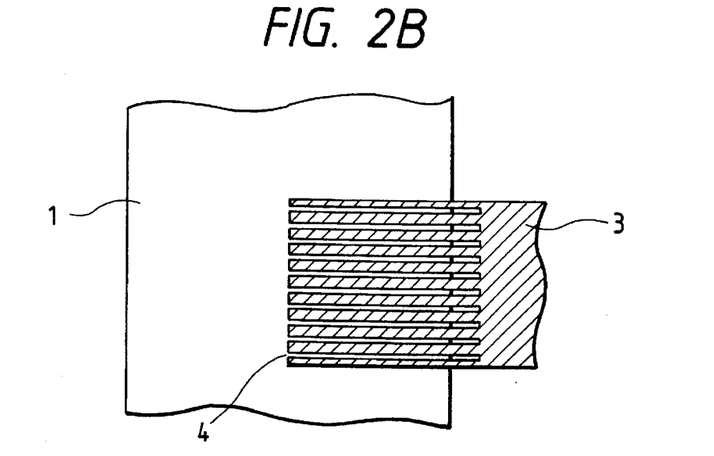

On the whole surface of the film thus formed, Al was vacuum-deposited (film thickness: 1500 Å) while the substrate temperature was maintained at a temperature lower than room temperature. Next, a negative resist was applied, and then a pattern of the surface electrode as illustrated in FIG. 2A was exposed and developed. Thereafter, Al was etched by conventionally known wet etching. Subsequently, the resist was peeled, and thus an MIM-type device having the surface electrode as illustrated in FIG. 2B was prepared. The dimensions of the part at which the surface electrode and the base electrode crossed each other were 1 mm × 1 mm. The width of the opening was 10 μm, and the pitch of openings was 50 μm.

The device thus prepared was placed under a vacuum of $2\times10^{-6}$ Torr or less, and a voltage was applied between the upper and lower electrodes. As a result, emission of electrons were observed. An electron-emission efficiency of about $1\times10^{-2}$ at maximum was obtained. With an increase in the number of the build-up of the insulating layer, a higher voltage had to be applied in order to obtain the like emitted currents. An electron-emission pattern was observed at a fluorescent plate disposed right above the device to reveal that a fluorescent pattern similar to the shape of the surface electrode was obtained. Moreover, the fluorescence showed a good uniformity.

The film thickness per one polyimide layer was determined by elipsometry to be about 3.6 Å. Next, the above procedure was repeated to prepare a device, except that the dimensions of the part at which the surface electrode and the base electrode crossed each other were 1 mm × 1 mm, the width of the opening was 100 μm, and the pitch of openings was 200 μm. The measurement was tried in the same manner. A relatively large voltage had to be applied, but an electron-emission efficiency of about $3\times10^{-3}$ at maximum was obtained. The electron-emission pattern observed at the fluorescent plate disposed right above the device was found to be similar to the shape of the surface electrode. The fluorescence also showed a good uniformity.

Example 2

Figure 3A:
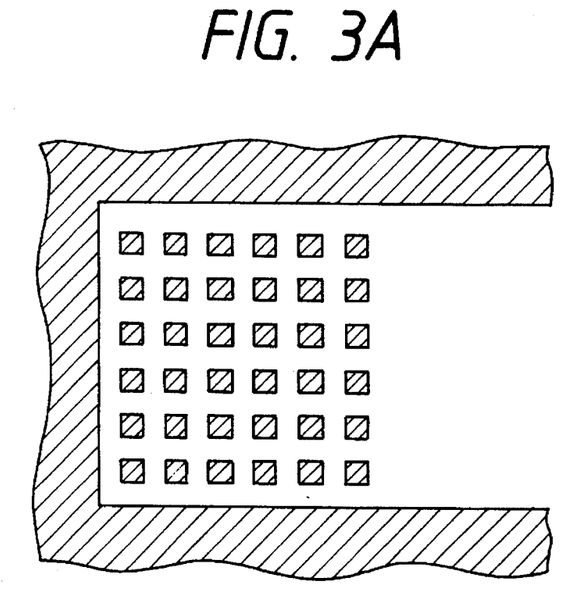
FIGS. 3A and 3B each illustrate a pattern of a surface electrode of the electron-emitting device according to the present invention.
Figure 3B:
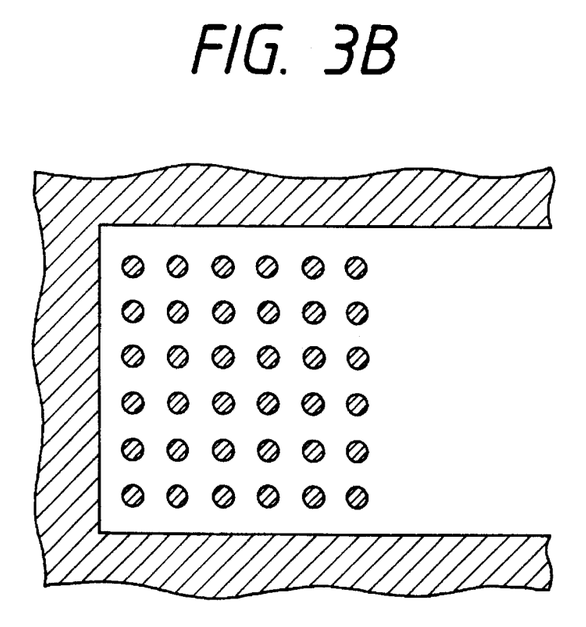

Example 1 was repeated to form a device, except that a pattern as illustrated in FIG. 3A or 3B was used as the pattern of the surface electrode. The dimensions of the opening shown in FIG. 3A were 10 μm × 10 μm; and the diameter of the opening shown in Fig. 3B was 15 μm. The pitch of openings was 50 μm in both instances. The electron-emission pattern was similar to the shape of the surface electrode, with the spread smaller than that in Example 1. The fluorescence showed a good uniformity in both instances, but, in the instance of FIG. 3A, a slightly stronger fluorescence was seen in the vicinity of corners of the openings.

In Examples having been described in the above, the LB method was used to form the insulating layer. However, any film formation methods that can form a very thin and uniform insulating organic thin film can be used without limitation to the LB method. They specifically include vacuum deposition, electrolytic polymerization, and CVD. Thus, the range of usable organic materials can be broadened.

In addition, the insulating layer 2 may be formed using an inorganic material, without limitation to the organic material.

Also regarding the formation of the electrode, any film formation methods can be used as previously mentioned, so long as they can form a uniform thin film on the organic thin film, without limitation to vacuum deposition and sputtering.

There are also no limitations on the materials for the substrate and the shape thereof.

Comparative Example

A device was prepared, having the same device area (1 mm × 1 mm) as in Example 1 but provided with no opening. Measurement was also made in the same manner as in Example 1. The surface electrode was made to have a film thickness of 200 Å. Here, the electron-emission pattern observed at the fluorescent plate was found to be similar to the shape of the surface electrode. The fluorescence also showed a good uniformity. However, the electron-emission efficiency was not more than $1\times10^{-3}$ at maximum. In the case of a device prepared to comprise a surface electrode with a film thickness of 150 Å, the electron-emission pattern was similar to the shape of the surface electrode, but unevenness occurred in fluorescence and the electron-emission efficiency was not improved, compared with the case when the surface electrode was formed with a film thickness of 200 Å. On the other hand, in a device made to comprise the surface electrode with a film thickness of 100 Å resulted a decrease in the electron-emission efficiency to $5\times10^{-4}$ or less, and also resulted in no similarity of the electron-emission pattern to the shape of the surface electrode, also bringing about a remarkable fluorescence unevenness. This is because, in the surface electrode formed with a film thickness of 100 Å, Al began to take an island structure, so that no uniform surface electrode was formed.

We claim:

1. An image display apparatus comprising:

an electron source including a plurality of lines of electron emitting devices;

modulating electrodes capable of modulating an electron beam emitted from said lines of electron-emitting devices, in accordance with an information signal; and an image forming member capable of forming an image as a result of irradiation with said electron beam, wherein each of the plurality of lines of electron emitting devices comprises plural electron emitting devices electrically connected in parallel with each other, each of said plural electron-emitting devices comprises a substrate, a first electrode provided on said substrate, an insulating layer having a thickness of from 100 Å to 5 Å laminated on said electrode, and a second electrode having plural openings and laminated on said insulating layer in such a manner that the insulating layer is uncovered at the plural openings and electrons are emitted from the plural openings of the second electrode as a result of application of a voltage between the electrodes and wherein said insulating layer comprises a monomolecular film of an organic compound or a built-up film of said monomolecular films and a ratio of area of the plural openings to that of the second electrode is 50% or less, and wherein, the first electrodes of the electron emitting devices of a line are electrically connected with each other and the second electrodes of the electron emitting devices of the line are electrically connected with each other.

2. An image display apparatus according to claim 1, wherein the width of said opening is 10 μm or less.

3. An image display apparatus comprising:

an electron source including a plurality of lines of electron emitting devices;

modulating electrodes capable of modulating an electron beam emitted from said lines of electron-emitting devices, in accordance with an information signal; and an image forming member capable of forming an image as a result of irradiation with said electron beam, wherein each of the plurality of lines of electron emitting devices comprises plural electron emitting devices electrically connected in parallel with each other, each of said plural electron-emitting devices comprises a substrate, a first electrode provided on said substrate, an insulating layer having a thickness of from 100 Å to 5 Å laminated on said electrode, and a second electrode having plural openings and laminated on said insulating layer in such a manner that the insulating layer is uncovered at the plural openings and electrons are emitted from the plural openings of the second electrode as a result of application of a voltage between the electrodes and wherein said insulating layer comprises a monomolecular film of an organic compound or a built-up film of said monomolecular films, formed by the Langmuir-Brodgett method (LB method) and a ratio of are of the plural openings to that of the second electrode is 50% or less, and wherein, the first electrodes of the electron emitting devices of a line are electrically connected with each other and the second electrodes of the electron emitting devices of the line are electrically connected with each other.

4. An image display apparatus according to claim 3, wherein the width of said opening is 10 μm or less.

\* \* \* \* \*